(12) United States Patent
Audinot et al.

(10) Patent No.: US 6,643,499 B1
(45) Date of Patent: Nov. 4, 2003

(54) APPARATUS AND METHOD FOR CONTROLLING A PHASE-LOCKED LOOP CIRCUIT

(75) Inventors: Pascal Audinot, Valbonne (FR); Andrew M. Henwood, Garland, TX (US)

(73) Assignee: Texas Instruments Incorporated, Dallas, TX (US)

(*) Notice: Subject to any disclaimer, the term of this patent is extended or adjusted under 35 U.S.C. 154(b) by 460 days.

(21) Appl. No.: 09/603,741

(22) Filed: Jun. 26, 2000

Related U.S. Application Data

(60) Provisional application No. 60/171,756, filed on Dec. 22, 1999.

(51) Int. Cl.[7] .............................. H04B 1/06; H04B 7/60
(52) U.S. Cl. ........................ 455/260; 455/67.1; 455/76; 331/2; 331/1 A; 375/376
(58) Field of Search .......................... 455/67.1, 76, 88, 455/255, 260, 263–265, 552, 575; 375/327, 373, 374, 375, 376; 331/2, 51, 1 A, 22, 31, 34; 327/147, 156, 159

(56) References Cited

U.S. PATENT DOCUMENTS

| | | | | |
|---|---|---|---|---|
| 5,125,107 A | * | 6/1992 | Herold et al. | 455/226.1 |
| 5,194,829 A | * | 3/1993 | Schoffel | 331/1 A |
| 5,276,913 A | * | 1/1994 | Lee et al. | 455/76 |
| 6,061,575 A | * | 5/2000 | Lombardi | 455/552 |
| 6,226,276 B1 | * | 5/2001 | Na | 370/294 |

* cited by examiner

Primary Examiner—Edward F. Urban
Assistant Examiner—Simon Nguyen
(74) Attorney, Agent, or Firm—William B. Kempler; W. James Brady, III; Frederick J. Telecky, Jr.

(57) ABSTRACT

A first and second phase-locked loop each having their frequency of operation under programmable control by changing the divider ratio. A single programming word contains the divider ratio for the first phase-locked loop and addressing bits which address a plurality of auxiliary registers for changing the divider ratio of the second phase-locked loop. In a cellular telephone, this allows the digital signal processor to change from receive to transmit mode or from one transmit mode or from one frequency to another utilizing a single command word.

20 Claims, 2 Drawing Sheets

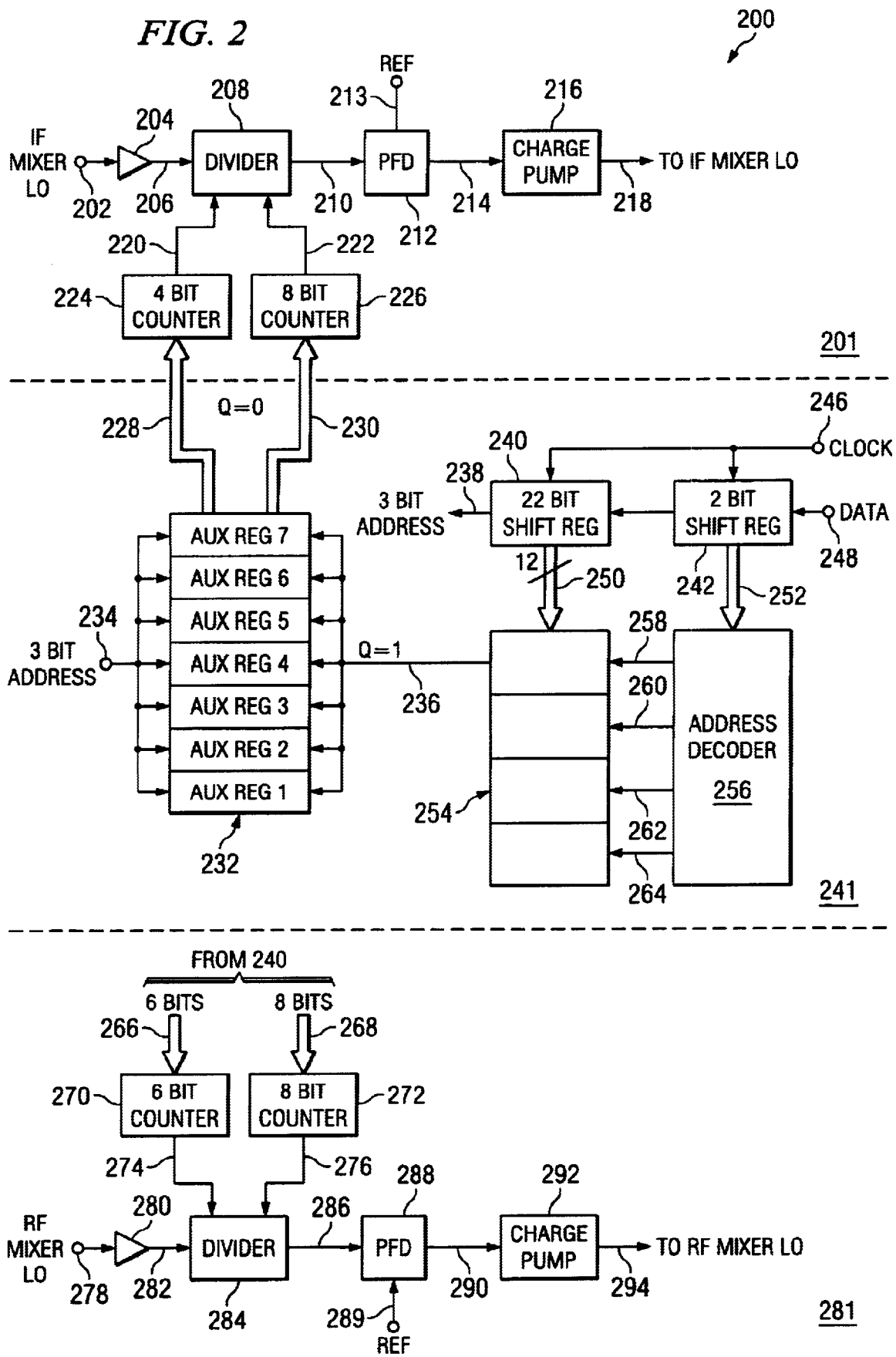

APPARATUS AND METHOD FOR CONTROLLING A PHASE-LOCKED LOOP CIRCUIT

This application claims priority under 35 U.S.C. §119(e)(1) of Provisional Application No. 60/171,756, filed Dec. 22, 1999.

BACKGROUND OF THE INVENTION

This invention relates to a method and apparatus for controlling a phase-locked loop (PLL). In particular, it relates to a method and apparatus for controlling a phase-locked loop for a cellular telephone.

Cellular telephones typically utilize two mixers for receiving an RF signal. A first mixer, or RF mixer, converts the incoming RF signal to an IF frequency. After passing through the IF filter circuit, the output frequency is passed through a second, or IF mixer. This IF mixer converts the IF frequency signal to a base band signal. The base band signal is then converted to a digital signal which is fed to an input of a digital signal processor for further processing. In the receive mode, the IF mixer is held at a constant frequency but the RF mixer is varied in frequency in order to receive one of the multiple channels in the RF band in which the cellular telephone operates. Each mixer has its own local oscillator, which in turn are part of separate phase-locked loop circuits TDMA (time division multiple access) cellular telephone systems, such as those utilized in the GSM standard, operate in a half duplex mode. This allows the local oscillator for both the RF and IF mixers in the receive circuit to be reused in the transmit circuit. The frequencies of operation for both the IF and RF mixer local oscillators are changed for the transmit mode. In order to reduce spurious frequencies generated in the transmit mode, it has been found necessary to change both the RF mixer local oscillators and IF mixer local oscillator frequencies with a particular set of RF and IF frequencies chosen for each channel on which the cellular telephone transmits, which has been specifically chosen to minimize such spurious transmissions.

The phase-locked loop circuits which generate the two local oscillator frequencies may both be on a single integrated circuit, for example. The operation of the two local oscillators is controlled by a digital signal generated by the digital signal processor of the cellular telephone via a serial interface. The serial interface transmits a 24 bit word to control the frequency of each of the local oscillators. Thus, to change the frequencies of the two local oscillators, requires a transmission of two 24 bit words. The transmission of the two 24 bit words is required when the cellular telephone enters the transmit mode. While in the transmit mode, the frequency of operation of a particular cellular telephone may be changed from time slot to time slot according to the needs of the cellular telephone cell in which the telephone is operated. Each time the frequency on which the cellular telephone is transmitting is changed, the two 24 bit words must be resent.

Each time the cellular telephone enters the transmit mode the digital signal processor has many tasks to perform. The time necessary to transmit these two 24 bit words creates a difficult timing environment for the programmer of the digital signal processor. In addition, the memory required for this procedure adds to the cost of the cellular telephone.

SUMMARY OF THE INVENTION

It is a general object of the present invention to produce a control circuit for a phase-locked loop circuit.

Another object of the present invention is to produce control circuit for a phase-locked loop circuit for a cellular telephone.

A further object of the invention is to control the operation of the RF mixer local oscillator and IF mixer local oscillator utilizing a single control word having fewer bits than required to control the two local oscillators.

These and other objects and features of the invention are attained by a first aspect of the present invention which includes a phase-locked loop circuit having a plurality of phase-locked loops. Each phase-locked loop has a voltage controlled oscillator operating at a different frequency, the frequency of operation of each voltage controlled oscillator being determined by a divide ratio of the voltage controlled oscillator output frequency to a phase frequency detector. The divide ratio for each phase-locked loop is programmable. A processor circuit coupled to the voltage controlled oscillators generates a control word for programming each of the voltage controlled oscillators. A first portion of the control word programs a divide ratio for a first voltage controlled oscillator and a second portion of the control word addresses an auxiliary register containing a control word for programming a divide ratio for a second voltage controlled oscillator.

Another aspect of invention includes a cellular telephone, having a phase-locked loop circuit for generating a first local oscillator frequency for a first mixer and a second local oscillator frequency different from the first local oscillator frequency for a second mixer. The frequency of the first and the second local oscillators is changed between first and second modes of operation of the cellular telephone. A first phase-locked loop generates the first local oscillator frequency. The frequency of operation of the first phase-locked loop being under programmable control. A second phase-locked loop generates the second local oscillator frequency the frequency of operation being under programmable control. A processor generates a control word coupled to the first and the second phase-locked loops. The control word has bits for setting the operating frequency of the first phase-locked loop and having fewer than the number of bits required to set the operating frequency of the second phase-locked loop.

A further aspect of the invention comprises a cellular telephone includes a transmit circuit, a receive circuit, and first and second mixers in said transmit circuit and third and fourth mixers in said receive circuit. A phase-locked loop circuit has a first phase-locked loop for generating a local oscillator frequency for said first and third mixers, said first local oscillator frequency being different during transmit and receive operation of said cellular telephone. A second phase-locked loop generates a local oscillator frequency for said second and fourth mixer, said second local oscillator frequency being different during transmit and receive operation of said cellular telephone and different from said first local oscillator frequency. A processor generates a single control word for setting the frequency of said first and said, second phase-locked loops, the control word has fewer bits than necessary to control the operating frequency of said first and said second phase-locked loops.

Yet another aspect of the invention includes a method for operating a cellular telephone having a plurality of phase-locked loops. Each phase-locked loop has a VCO operating at a different frequency. The frequency of operation of each VCO is determined by a divide ratio of the VCO output frequency to a phase frequency detector, the divide ratio being programmed by processor. The method includes serially transmitting a control word from the processor to a phase-locked loop circuit for programming a first and a second divide ratio for a first and second VCO, respectively. The control word is decoded to generate a divide ratio for the first VCO and an address of an auxiliary register. The auxiliary register is addressed to read out a divide ratio for the second

BRIEF DESCRIPTION OF THE DRAWINGS

FIG. 2 is a block diagram of a control and phase-locked loop circuit of the present invention.

DETAILED DESCRIPTION OF THE INVENTION

Figure 1:
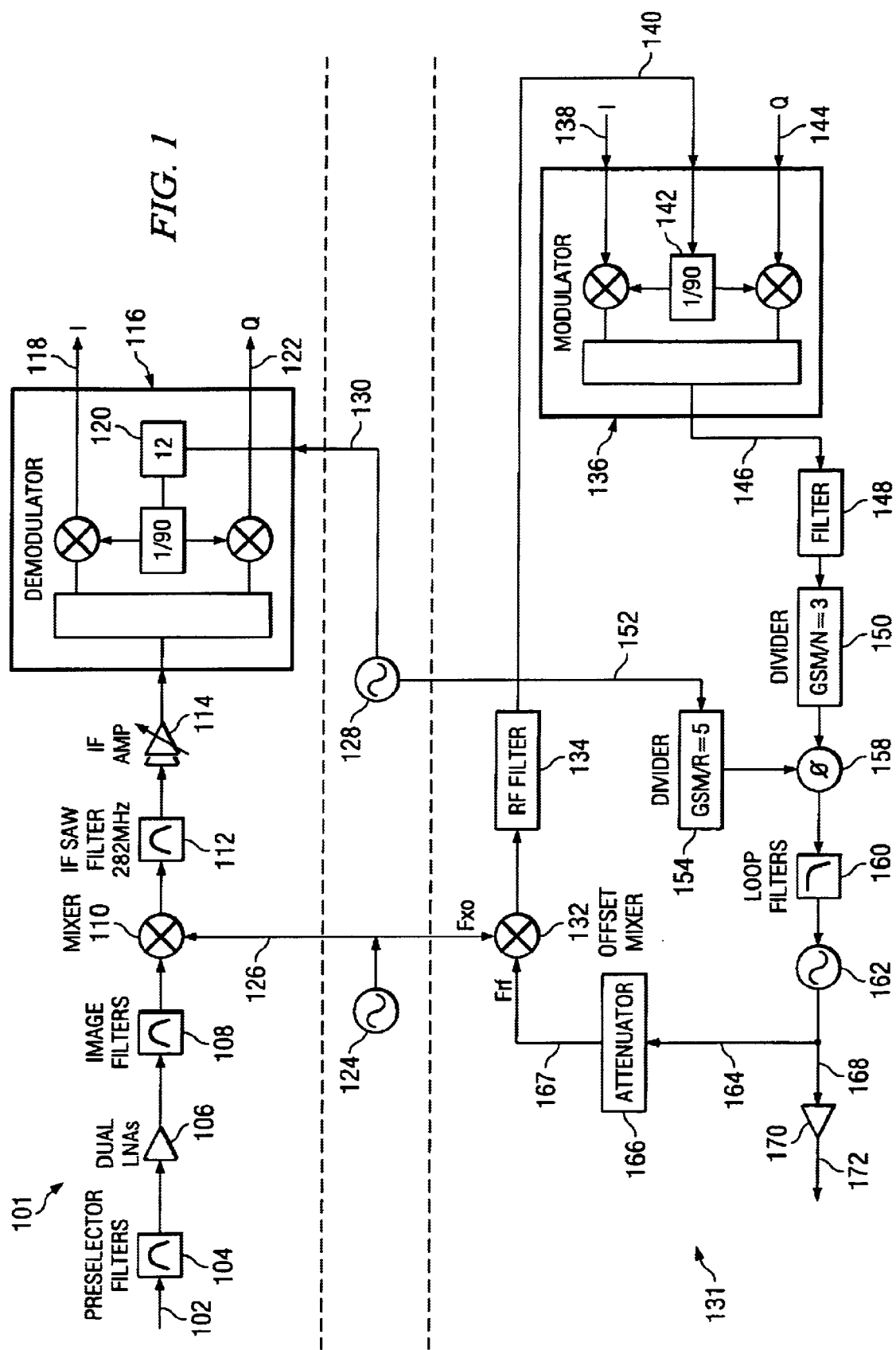
FIG. 1 is a block diagram of a cellular telephone.

FIG. 1 illustrates a block diagram of a cellular telephone in accordance with the present invention generally as 100. The cellular telephone has a receiver circuit 101, a transmitter circuit 131, and two voltage controlled oscillators (VCO) 124, 128 which are shared between the receiver and the transmitter circuits. The receiver circuit includes preselector filters 104, dual low noise amplifiers 106, image filters 108, RF mixer 110, IF SAW filter 112, IF amplifiers 114, and demodulator 116. Demodulator 116 contains two mixers, an I (in-phase) and Q (quadrature phase) mixer. Together these act as the IF mixer for the receiver circuit. The transmitter circuit 131 includes modulator 136, filter 148, dividers 150 and 154, phase comparator 158, loop filter 160, VCO 162, RF amplifier 170, attenuator 166, RF mixer 132, and RF filter 134. Modulator 136 utilizes two mixers, an I or in-phase and Q or quadrature phase mixer. These two mixers function as the second mixer in the transmitter circuit.

In the receiver circuit, the RF signal received from the antenna on line 102 passes to preselector filters 104, which are generally bandpass filters, to eliminate interference caused by out-of-band signals. The filtered signal then passes to one of dual low noise amplifiers 106 and the amplifier output is passed to image filters 108, which are another set of bandpass filters, to attenuate signals at frequencies outside the area of interest and serially attenuate signals which may cause images in the IF circuit. The output of the image filters 108 is passed to RF mixer 110 which receives a signal from local oscillator 124 on line 126. The local oscillator 124 operates at a frequency which is offset from the desired receive frequency by the IF frequency of 282 MHz, for example. The sum and difference frequencies generated by the RF mixer 110 pass to IF SAW filter 112 which operates at the 282 MHz IF frequency. The preselected reception frequency signal passes to multi-stage gain controlled IF amplifier 114. The output of the IF amplifier 114 passes to demodulator 116 which receives the output of the IF VCO 128 on line 130. The signal on line 130 passes to divider 120 where it is divided by two to generate in-phase and quadrature phase (shifted by 90°) signals which pass to the demodulator 116 having mixers 118 and 122 to generate the in-phase signal I on line 118 and quadrature phase signal "Q" on line 122.

In the transmitter circuit, the modulator 136 receives the data to be transmitted on line 138 as an in-phase signal and on line 144 as a quadrature phase signal. Each of these are mixed with the output of RF mixer 132, after passing to RF filter 134 and via line 146 to divide by two circuit 142. Divider 142 generates the in-phase and quadrature phase signals for the separate modulator mixers for the in-phase and quadrature phase data signals. The output of the modulator on line 146 passes to filter 148 and dividers 150. The output of IF VCO 128 on line 152 passes to divider 154 having an output on line 156 which is fed to phase comparator 158. The output of divider 150 is also fed to phase comparator 158. The output of the phase comparator passes to loop filter 160 and to VCO 162 and to the input of power RF amplifier 170. The output of RF amplifier 170 on line 172 is passed to the transmission antenna (not shown). The output of VCO 162 on line 164 passes to attenuator 166. The output of attenuator 166 on line 167 is coupled to the RF mixer 132. RF filters 134, filter 148, and loop filters 160 are typically low-pass filters.

FIG. 2 illustrates a control circuit for controlling the RF and the IF mixers shown in FIG. 1, generally as 200. Circuit 200 includes a first PLL circuit 201 for controlling the IF mixer local oscillator and a second PLL circuit 281 for controlling the RF mixer local oscillator.

The RF mixer local oscillator phase-locked loop 281 receives the output of the RF mixer local oscillator 124 on line 278. This signal is buffered by buffer 280 having an output on line 282 which is passed through to divider 284. Divider 284 receives a 12 bit divide ratio from counters 270 and 274 via lines 274 and 276. The output of the divider on line 286 is the local oscillator frequency divided by the number represented by the 14 bits in counters 270 and 272. This signal passes to phase frequency detector 288 and which compares the result of the reference frequency received on line 289. The output on signal 290 is used to control a charge pump 292 which is coupled via line 294 to the input of the voltage controlled oscillator 124. As is well known to those skilled in the art, the output of the charge pump on line 294 is used to charge or discharge a capacitor coupled to the input of the voltage controlled oscillator 124 (not shown). Typically, a low pass filter is also coupled to this input (not shown). Similarly, phase-locked loop 201 receives the output of the IF mixer local oscillator 128 on line 202. This signal passes to through buffer 204 having output on line 206 which is coupled to divider 208. Divider 208 receives a 12 bit divide ratio from counters 224 and 226 via lines 220 and 222, respectively. The IF mixer local oscillator signal on line 130 is divided by the ratio determined by the 12 bit number and the result appears on line 210. The IF mixer local oscillator on line 210 is compared by phase frequency detector 212 and the reference frequency on line 213 and produces a resulting phase signal on line 214, as is well known to those skilled in the art. In the illustrated embodiment the reference frequency on 213 and 289 are identical but this is not required. The signal on line 214 operates charge pump 216 having an output on line 218 which is coupled to the IF mixer local oscillator. As is well known to those skilled in the art, a capacitor and low-pass filter are typically coupled to the input of the local oscillator (not shown in the figures).

In the receive mode, the IF mixer local oscillator operates at a fixed frequency. That means that the PLL operates at a fixed divide ratio. This fixed divide ratio is provided by means not shown in the figure when the cellular telephone enters the receive mode. One possible way of providing this fixed divide number is to add an eighth register having the unused eighth address to the register bank 232 which contains this fixed divide ratio. The RF mixer local oscillator operates at a frequency which is determined by the channel which the cellular telephone is to receive. The frequency to be received is determined by the digital signal processor in the telephone (not shown) which serially transmits the data signal on line 248 to 2 bit shift register 242 and 22 bit shift register 240 by means of a clocking signal on line 246. Of the 22 bits in shift register 240 are 14 bits that are transferred via lines 266 and 268 to 6 bit counter 270 and 8 bit counter 272, respectively. The varied divide ratio, as is well known to those skilled in the art, causes the RF mixer local oscillator to change frequencies in order to receive the desired channel.

In the transmit mode, the frequency of both the RF mixer local oscillator 124 and the IF mixer local oscillator 128 must be changed. Of the 24 bit word transmitted from digital signal processor on line 248, 2 bits are utilized to control address decoder 256, and 3 bits are utilized to control the charge level of the charge pump (not shown). Of the 19 remaining bits, 14 are required to change the transmit frequency by varying the divide ratio in the RF mixer local oscillator. Of the 5 remaining bits, one is utilized to control the reception of the 24 bit word and a "Q" bit is used to control the function of the auxiliary register address, leaving only 3 bits left to control the frequency of the IF mixer local oscillator. As stated above, its been found necessary to change both the RF mixer local oscillator frequency and IF mixer local oscillator frequency each time the transmit mode is entered, so that a particular chosen combination of both RF frequency and IF frequency can be utilized which reduces spurious transmissions. In the present invention, the 3 bits available to change the IF mixer local oscillator frequency are input to line 234 which is used as an address for the 7 registers in the register bank 232. Each of these auxiliary registers contains the 12 bit code for a desired IF mixer local oscillator frequency to be used in combination with a particular transmit channel. The 3 bit address is sufficient to decode the chosen one of the auxiliary registers 232 and to transmit that data via lines 228 and 230 to 4 bit counter 224 and 8 bit counter 226, respectively. It is now possible to change the frequencies of the RF mixer local oscillator and IF mixer local oscillator utilizing a single 24 bit word. This saves the time required to transmit a second 24 bit word and the programming complexity necessary to do so, which reduces the amount of program memory in the cellular telephone.

The data in the auxiliary registers 1–7 in the bank 232 need to be programmed with the 12 bit number used for the divide ratio in the PLL 201 in the transmit mode. This is accomplished at startup in a test mode in which a 24 bit word of data is input to shift registers 240 and 242 via line 248 and the clock signal on line 246. The data passes to decoder 256 via line 252 which controls multiplexer 254 to select a path indicated by the 2 bit address on line 252. The data in shift register 240 passes via lines 250 when the address decoder 256 indicates the first path is active to line 236 and the data is input to the 7 auxiliary registers if the "Q" bit of the 22 bit word in shift register 240 is a "1" send out an adjust signal. The 3 bits in the 22 bit word used to address the auxiliary registers on line 234 will select the register that will store the data word. This is repeated until all 7 registers have been loaded with the respective divide ratio for the transmit mode. During operation of the cellular telephone, the "Q" bit is set to zero, which indicates that the data is not to be loaded into the registers 1–7, but to be read therefrom.

The operation of the cellular telephone is described using the GSM standard by way of a nonlimitive example. In a GSM transmission, the received frequency channels are between 925 and 960 MHz. Preselector filters 104 are set to attenuate or serially attenuate signals outside this band. The output of preselector filters 104 is amplified by one of dual low noise amplifiers 106 and passed to image filters 108. Image filters 108 are bandpass filters, to attenuate nonselected frequencies and to serially attenuate images that would be generated in the IF circuit. The output is then passed to RF mixer 110 where it is mixed with the output of local oscillator 124 via line 126. In the receive mode, the VCO of the RF mixer local oscillator 124 operates at a frequency between 1207 and 1242 MHz, which produces a difference frequency having a difference of 282 MHz from the desired channel to be received. The output of the mixer 110 is passed to IF SAW filter 112 which operates at 282 MHz and eliminates severely attenuates signals outside this band including the sum of the local oscillator frequency and received frequency which is above 2 GHz. The thus selected channel is passed to a multi-stage gain controlled IF amplifier 114 and to demodulator 116 which receives an output on line 130 from the IF VCO 128. The IF VCO operates on a frequency of 564 MHz which is fixed for the receive mode. The divide by 2 circuit 120 produces in-phase and quadrature phase signals which mixed with the output of IF amplifiers 114 and mixers within the modulator 116 to produce the I or in-phase signal on line 118 and a Q or the quadrature signal on line 122. These signals are fed to the digital signal processor of the cellular telephone for further processing (not shown). It should be noted that preselector filters 104, dual low noise amplifiers 106, image filters 108, RF mixer 110, IF SAW filter 112, RF amplifiers 114, demodulator 116 and VCO 128 are conventional in the art and need not be described in detail here.

The IF VCO operates in the frequency range of 541–567 MHz. The signal to be transmitted is received on liens 138 and 144 of the modulator 136 from the digital signal processor (not shown). The signal on line 138 is the I or in-phase signal and the signal on line 144 is the Q or the quadrature phase signal. These signals are used to modulate the output of RF mixer 132 via RF filter 134 on line 140.

The output of the modulator on line 146 passes through filter 148 to divider 150. Divider 150 divides the frequency of this signal by 3, for example, in a GSM cellular telephone. The output of divider 150 passes to phase comparator 158 which also receives the output of divider 154. Divider 154 divides the output of frequency of IF VCO 128 by 5, for example, in a GSM cellular telephone. The output of phase detector 158 passes through loop filter 160 to control the operating frequency of VCO 162. The output of VCO 162 on line 168 passes to power amplifier 170 having an output 172 coupled to a transmitting antenna (not shown). The output of VCO 162 also passes via line 164 through attenuator 166 to an input of RF mixer 132. The RF mixer 132, RF filter 134, modulator 136, filters 148, 160, dividers 150, 154, phase comparator 158, voltage controlled oscillators 124, 162, attenuate 166 and power amplifier are known in the art and need not be described in detail here.

In a GSM system, channel spacing of 200 KHz can be achieved by utilizing a stable 13 MHz oscillator having an output which is divided by 65 to generate a 200 KHz signal which is the reference signals 213, 289 in FIG. 2.

The present invention saves the 10 microseconds needed to transmit second 24 bit word whenever the cellular telephone enters the transmit mode or switches transmission frequency. This reduces the complexity of the program for the digital signal processor in the cellular telephone, saving 8 k bytes of program memory, reducing the cost of the cellular telephone.

While the invention has been particularly shown and described with reference to preferred embodiments thereof, it is well understood by those skilled in the art that various changes and modifications can be made in the invention without departing from the spirit and the scope of the invention as defined by the appended claims.

What is claimed is:

1. A phase-locked loop circuit comprising:

a plurality of phase-locked loops, each phase-locked loop having a voltage controlled oscillator operating at a different frequency, the frequency of operation of each voltage controlled oscillator being determined by a divide ratio of the voltage controlled oscillator output frequency to a phase frequency detector, said divide ratio for each phase-locked loop being programmable;

a processor circuit coupled to said voltage controlled oscillators for generating a control word for programming each of said voltage controlled oscillators, a first portion of said control word programming a divide ratio for a first voltage controlled oscillator and a second portion of said control word addressing an auxiliary register containing a control word for programming a divide ratio for a second voltage controlled oscillator.

2. In a cellular telephone, a phase-locked loop circuit for generating a first local oscillator frequency for a first mixer and a second local oscillator frequency different from said first local oscillator frequency for a second mixer, the frequency of said first and said second local oscillators being changed between first and second modes of operation of said cellular telephone comprising:

a first phase-locked loop for generating said first local oscillator frequency, a frequency of operation said first phase-locked loop being under programmable control;

a second phase-locked loop for generating said second local oscillator frequency, a frequency of operation said second phase-locked loop being under programmable control;

a processor for generating a control word coupled to said first and said second phase-locked loops, said control word having bits for setting the operating frequency of said first phase-locked loop and having fewer than the number of bits required to set the operating frequency of said second phase-locked loop.

3. The phase-locked loop circuit of claim 2 wherein said first mode is a transmit mode and said second mode is a receive mode.

4. The phase-locked loop circuit of claim 3 wherein said processor transmits said control word to said first and said second phase-locked loops via a serial interface.

5. The phase-locked loop circuit of claim 3 further comprising an auxiliary register containing a control word for programming a divide ratio for said phase-locked loop.

6. The phase-locked loop circuit of claim 2 wherein said first mode is a transmit mode at a first frequency and said second mode is a transmit mode a at a second frequency different from said first frequency.

7. The phase-locked loop circuit of claim 6 wherein said processor transmits said control word to said first and said second phase-locked loops via a serial interface.

8. The phase-locked loop circuit of claim 6 further comprising an auxiliary register containing a control word for programming a divide ratio for said phase-locked loop.

9. The phase-locked loop circuit of claim 2 wherein said processor transmits said control word to said first and said second phase-locked loops via a serial interface.

10. The phase-locked loop circuit of claim 2 further comprising an auxiliary register containing a control word for programming a divide ratio for said phase-locked loop.

11. A cellular telephone comprising:

a transmit circuit;

a receive circuit;

first and second mixers in said transmit circuit and third and fourth mixers in said receive circuit;

a phase-locked loop circuit having a first phase-locked loop for generating a local oscillator frequency for said first and third mixers, said first local oscillator frequency being different during transmit and receive operations of said cellular telephone, and a second phase-locked loop for generating a local oscillator frequency for said second and fourth mixers, said second local oscillator frequency being different during transmit and receive operations of said cellular telephone and different from said first local oscillator frequency;

a processor for generating a single control word for setting the frequency of said first and said second phase-locked loop, said control word having bits for setting the operating frequency of said first phase-locked loop and having fewer than the number of bits required to set the operating frequency of said second phase-locked loop.

12. The cellular telephone of claim 11 wherein the operating frequency of said first and said second phase-locked loop are under programmable control.

13. The cellular telephone of claim 12 further comprising a plurality of auxiliary registers containing a control word for programming an operating frequency of said second phase-locked loop.

14. The cellular telephone of claim 13 wherein said plurality of auxiliary registers are addressed by bits in said control word, a number of bits in each said auxiliary register exceeding a number of bits needed to address said register.

15. A method for operating a cellular telephone having a plurality of phase-locked loops, each phase-locked loop having a voltage controlled oscillator operating at a different frequency, the frequency of operation of each voltage controlled oscillator being determined by a divide ratio of the voltage controlled oscillator output frequency to a phase frequency detector, said divide ratio being programmed by processor, the method comprising:

serially transmitting a control word from said processor to a phase-locked loop circuit for programming first and second divide ratios for first and second voltage controlled oscillators, respectively;

decoding said control word to generate a divide ratio for said first voltage controlled oscillator and an address of an auxiliary register;

addressing said auxiliary register to read out a divide ratio for said second voltage controlled oscillator.

16. The method of claim 15 wherein said cellular telephone is in a transmit mode.

17. The method of claim 16 wherein said cellular telephone switches from one transmit frequency to another.

18. The method of claim 15 wherein said second voltage controlled oscillator operates at a fixed frequency in a receive mode.

19. The method of claim 15 wherein the frequency of operation of said first and said second voltage controlled oscillators are chosen to minimize spurious frequency transmission in the transmit mode.

20. The method of claim 15 wherein said control word is 24 bits in length, and wherein 3 bits of said control word address 7 registers containing a 12 bit divide ratio for said second voltage controlled oscillator.

* * * * *